United States Patent
Jin et al.

(10) Patent No.: US 9,123,543 B1
(45) Date of Patent: Sep. 1, 2015

(54) SEMICONDUCTOR DEVICE AND MANUFACTURING METHOD THEREOF

(75) Inventors: Jung Gi Jin, Jeju-do (KR); Jong Sik Paek, Seoul (KR); Sung Su Park, Seoul (KR); Seok Bong Kim, Seoul (KR); Tae Kyung Hwang, Seoul (KR); Se Woong Cha, Seoul (KR)

(73) Assignee: Amkor Technology, Inc.

( * ) Notice: Subject to any disclaimer, the term of this patent is extended or adjusted under 35 U.S.C. 154(b) by 111 days.

(21) Appl. No.: 13/274,877

(22) Filed: Oct. 17, 2011

Related U.S. Application Data

(62) Division of application No. 12/116,695, filed on May 7, 2008, now Pat. No. 8,058,726.

(51) Int. Cl.
- *H01L 23/48* (2006.01)
- *H01L 23/52* (2006.01)
- *H01L 23/00* (2006.01)

(52) U.S. Cl.
CPC ...................................... *H01L 24/05* (2013.01)

(58) Field of Classification Search
CPC ............................. H01L 24/03; H01L 23/3192
USPC ................. 257/678, 690, 700, 737, 738, 780, 257/E21.5, E23.01, E23.012, E23.019, 257/E23.02, E23.021, E21.499, 786, 773; 438/108, 125, 126, 612, 613, 614, 618, 438/620, 674
See application file for complete search history.

(56) References Cited

U.S. PATENT DOCUMENTS

| | | | |
|---|---|---|---|
| 5,464,794 A | 11/1995 | Lur et al. | |
| 6,410,414 B1 | 6/2002 | Lee | |
| 6,455,408 B1 | 9/2002 | Hwang et al. | |
| 6,620,633 B2 | 9/2003 | Hembree et al. | |
| 6,809,415 B2 * | 10/2004 | Tsukada et al. | 257/693 |
| 6,835,595 B1 | 12/2004 | Suzuki et al. | |
| 7,023,088 B2 | 4/2006 | Suzuki et al. | |
| 7,157,363 B2 | 1/2007 | Suzuki et al. | |
| 7,183,645 B2 | 2/2007 | Kurosawa et al. | |
| 7,205,660 B2 | 4/2007 | Park et al. | |
| 7,435,781 B2 | 10/2008 | Dharmarajan et al. | |

(Continued)

FOREIGN PATENT DOCUMENTS

JP    2008-218629    9/2008

OTHER PUBLICATIONS

Jin et al., "Semiconductor Device Having Redistribution Layer", U.S. Appl. No. 12/116,695, filed May 7, 2008.

(Continued)

*Primary Examiner* — Nitin Parekh
(74) *Attorney, Agent, or Firm* — McAndrews, Held & Malloy, Ltd.

(57) ABSTRACT

A semiconductor device and method of manufacturing the same are provided. The semiconductor device comprises a semiconductor die including a bond pad, a redistribution layer, and a solder ball. The redistribution layer is formed by sequentially plating copper and nickel, sequentially plating nickel and copper, or sequentially plating copper, nickel, and copper. The redistribution layer includes a nickel layer in order to prevent a crack from occurring in a copper layer. Further, a projection is formed in an area of the redistribution layer or a dielectric layer to which the solder ball is welded and corresponds, so that an area of the redistribution layer to which the solder ball is welded increases, thereby increasing bonding power between the solder ball and the redistribution layer.

18 Claims, 16 Drawing Sheets

(56) References Cited

U.S. PATENT DOCUMENTS

| | | | |
|---|---|---|---|
| 7,701,056 B2* | 4/2010 | Su | 257/737 |
| 8,341,835 B1 | 1/2013 | Huemoeller et al. | |
| 2001/0025414 A1 | 10/2001 | Toyoshima et al. | |
| 2002/0076913 A1 | 6/2002 | Lee | |
| 2003/0062336 A1 | 4/2003 | Restaino et al. | |
| 2003/0214038 A1 | 11/2003 | Nemoto | |
| 2004/0203181 A1* | 10/2004 | Shang et al. | 438/30 |
| 2006/0038291 A1 | 2/2006 | Chung et al. | |
| 2006/0076679 A1* | 4/2006 | Batchelor et al. | 257/737 |
| 2007/0176290 A1* | 8/2007 | Park et al. | 257/737 |
| 2007/0252275 A1 | 11/2007 | Huang et al. | |
| 2007/0290300 A1 | 12/2007 | Kawakami | |
| 2008/0012124 A1 | 1/2008 | Stapleton et al. | |
| 2009/0166859 A1 | 7/2009 | Yuan et al. | |
| 2010/0075493 A1 | 3/2010 | Ishikawa et al. | |
| 2011/0204528 A1 | 8/2011 | Matsutani et al. | |
| 2011/0229822 A1 | 9/2011 | Stapleton | |
| 2011/0291274 A1* | 12/2011 | Meyer et al. | 257/738 |
| 2013/0062761 A1 | 3/2013 | Lin et al. | |
| 2013/0187269 A1 | 7/2013 | Lin et al. | |

OTHER PUBLICATIONS

Nangalia et al., "Electronic Component Package Fabrication Method and Structure," U.S. Appl. No. 13/327,440, filed Dec. 15, 2011.

Anderson et al., "Advances in WLCSP Technologies for Growing Market Needs," Proceedings of SMTA's 6$^{th}$ Annual International Wafer Level Packaging Conference, Oct. 27-30, 2009, 6 pages, Santa Clara, CA.

Stapleton et al., "Reliability of 400 μm Pitch WLCSP Assemblies with Solder Supporting Material," IWLPC Conference Proceedings, Oct. 30, 2009, pp. 168-171.

Stapleton, "Wafer Level Packaging: A Materials Roadmap," IMAPS Chandler, Aug. 2009, 21 pages.

No author provided, "Fujikura Wafer Level Chip Sized Package (WLCSP) Design Guide", May 16, 2001, Rev. 1.4e, 14 pages.

No author provided, "Wafer-Applied Underfill, LORD Scientist Featured by IMAPS," LORD Corporation News Center, 1 page. [online], Retrieved on Nov. 3, 2011 from the Internet: <URL:http://www.lord.com/news-center/news-stories/wafer-applied-underfill-lord-scientist-featured-by-imaps.xml>.

No author provided, "LORD Corporation's Stapleton to Speak at International Wafer-Level Packaging Conference," LORD Corporation News Center, 1 page [online], Retrieved on Nov. 3, 2011 from the Internet: <URL:http://www.lord.com/news-center/press-releases/lord-corporations-stapleton-to-speak-at-international-wafer-level-packaging-conference.xml>.

Nangalia et al., "Electronic Component Package Fabrication Method and Structure," U.S. Appl. No. 13/765,388, filed Feb. 12, 2013.

Nangalia et al., "Electronic Component Package Fabrication Method and Structure," U.S. Appl. No. 13/447,650, filed Apr. 16, 2012.

* cited by examiner

SEMICONDUCTOR DEVICE AND MANUFACTURING METHOD THEREOF

RELATED APPLICATIONS

This application is a divisional of Jin et al., U.S. patent application Ser. No. 12/116,695, filed on May 7, 2008, entitled "SEMICONDUCTOR DEVICE HAVING REDISTRIBUTION LAYER", now U.S. Pat. No. 8,058,726, issued on Nov. 15, 2011, which is herein incorporated by reference in its entirety.

BACKGROUND OF THE INVENTION

1. Field of the Invention

The present invention relates to a semiconductor device and a method of manufacturing the same.

2. Description of the Related Art

Chip size packages (CSPs) are generally completed directly after each of semiconductor-processed wafers is singulated into a semiconductor chip. However, wafer level packages (WLPs) are completed after circuit is redistributed or is flip-chip bumped in a wafer state and then is singulated. Therefore, wafer level chip size packages (WLCSPs) are processed in a wafer level and have the same size as the semiconductor chip.

WLCSPs are processed in a wafer level and have the same size as the semiconductor chip. The size of packages is the same as that of chips. Thus, WLCSPs have almost the same size as that of semiconductor chips and are small-sized. WLCSPs are processed in a wafer level, making it possible to mass-produce WLCSPs, thereby reducing their manufacturing costs.

WLCSPs comprise wafers, redistribution layers formed on the upper surfaces, and solderballs. Semiconductor chips having bond pads are formed on the upper surface of wafers, and redistribution layers are formed on the upper surfaces of wafers in order to redistribute bond pads. In more detail, redistribution layers are used to redistribute peripherally formed bond pads in a grid pattern. Further, redistribution layers are generally formed of copper (Cu) having excellent electrical characteristics.

However, since copper (Cu) easily responds to oxygen in the atmosphere as is widely well known, its surface is easily oxidized during a high temperature hardening process, etc. Therefore, such property of copper (Cu) acts as a factor of dropping a contact power between redistribution layers and solder balls.

Meanwhile, WLCSPs that are realized as final package products perform a drop test to check reliabilities of electric characteristics and hardness. However, conventional WLCSPs comprise solder balls formed on just right surfaces of wafers so that mechanical stress transferred from outside is delivered to solder balls, which drops a board level reliability including solder bonding.

At the same time, external mechanical stress is also delivered to redistribution layers. In this regard, since redistribution layers have a monotonous structure using plated copper (Cu), they cannot absorb external shocks, which causes a crack at an edge of surfaces where solder balls and redistribution layers contact.

BRIEF SUMMARY OF THE INVENTION

In accordance with one embodiment, a semiconductor device includes a semiconductor die. The semiconductor die includes a first surface, a second surface opposite the first surface, at least one bond pad formed on the first surface, and a passivation layer formed on the first surface excluding the bond pad such that the bond pad is exposed through the passivation layer. A first dielectric layer is formed on the passivation layer such that the bond pad is exposed through the first dielectric layer. A redistribution layer is connected to the bond pad and formed on the first dielectric layer. The redistribution layer includes a copper plated layer and a nickel plated layer. A second dielectric layer is formed with an opening so that an exposed area of the redistribution layer is externally exposed through the opening while the remaining area of the redistribution layer is covered by the second dielectric layer. Further, a solder ball is welded to the exposed area of the redistribution layer.

Since the nickel plated layer has excellent malleability and ductility, the nickel plated layer prevents cracking of the first copper plated layer from stress applied to the solder ball. Further, the nickel plated layer provides a barrier layer for preventing the first copper plated layer from reacting with the solder ball.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
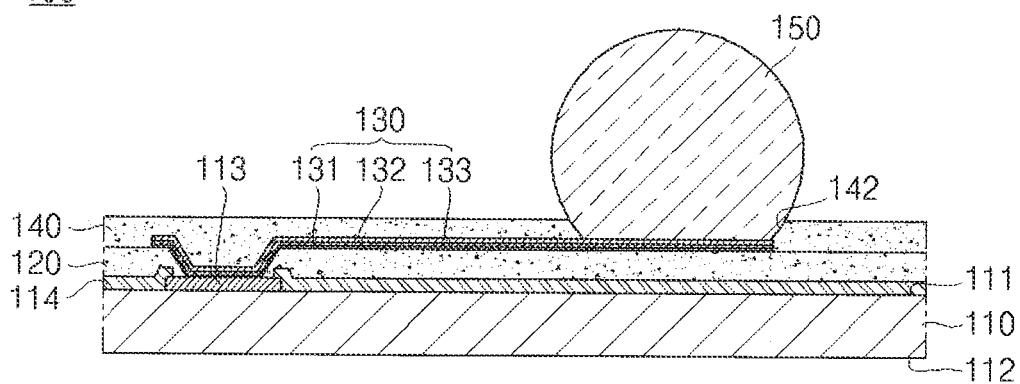
FIG. 1 is a cross-sectional view of a semiconductor device according to an embodiment of the present invention.

Referring to FIG. 1, a cross-sectional view of a semiconductor device 100 according to an embodiment of the present invention is shown.

As shown in FIG. 1, the semiconductor device 100 of the present embodiment of the present invention comprises a semiconductor die 110, a first dielectric layer 120, a redistribution layer 130, a second insulating layer 140, and a solder ball 150.

The semiconductor die 110 has a first surface 111 that is roughly flat and a second surface 112 that is also roughly flat on the opposite side of the first surface 111. At least one bond pad 113 can be formed on the first surface 111 of the semiconductor die 110. Furthermore, a passivation layer 114 can be formed on the first surface 111 that is a circumferential surface of the bond pads 113.

The passivation layer 114 can be formed of Polylmide (PI), Benzo Cyclo Butene (BCB), Poly Benz Oxazole (PBO), BismaleimideTriazine (BT), phenolic resin, epoxy, Silicone (Si), silicon oxide film ($SiO_2$), silicon nitride film ($Si_3N_4$), and one selected from a group consisting of materials equivalent to those described above but the present invention is not limited thereto.

The first dielectric layer 120, sometimes called a first insulating layer 120, having a predetermined thickness is formed on the passivation layer 114 that is a circumferential surface of the bond pads 113. In more detail, the first dielectric layer 120 does not cover the bond pads 113 but only cover the passivation layer 114.

The first dielectric layer 120 can be formed of Polylmide (PI), Benzo Cyclo Butene (BCB), Poly Benz Oxazole (PBO), BismaleimideTriazine (BT), phenolic resin, epoxy, Silicone (Si), silicon oxide film ($SiO_2$), silicon nitride film ($Si_3N_4$), and one selected from a group consisting of materials equivalent to those described above but the present invention is not limited thereto.

The thickness of the first dielectric layer 120 can be approximately between 3~15 μm. If the thickness of the first dielectric layer 120 is less than 3 μm, absorption efficiency of mechanical stress that is delivered from an external device to the solder ball 150 is reduced. Further, if the thickness of the first dielectric layer 120 is greater than 15 μm, the thickness of the semiconductor device 100 excessively increases.

The redistribution layer 130 has one end electrically connected to the bond pads 113 and another end extended to a predetermined length on the first dielectric layer 120. As described above, the redistribution layer 130 is used to redistribute the peripheral bond pads 113 in a grid pattern.

The redistribution layer 130 comprises a first copper plated layer 131, a nickel plated layer 132, and a second copper plated layer 133. Further, the first copper plated layer 131 and the second copper plated layer 133 are generally formed of copper (Cu). The nickel plated layer 132 is generally formed of nickel (Ni).

The thickness of the first copper plated layer 131 can be approximately between 1 and 2 μm. If the thickness of the first copper plated layer 131 is less than 1 μm, it is difficult to substantially manufacture the first copper plated layer 131 and its electrical conductivity may be dropped. If the thickness of the first copper plated layer 131 is greater than 2 μm, its manufacturing costs and time may be increased.

The thickness of the nickel plated layer 132 can be approximately between 2~4 μm. If the thickness of the nickel plated layer 132 is less than 2 μm, its resistance to a crack that may occur in the second copper plated layer 133 is reduced, causing a reduction in reliability. If the thickness of the nickel plated layer 132 is greater than 4 μm, its manufacturing costs and time may be increased.

The thickness of the second copper plated layer 133 can be approximately between 2~6 μm, and in one particular embodiment, between 2~4 μm. If the thickness of the second copper plated layer 133 is less than 2 μm, since a metal compound layer between the second copper plated layer 133 and the solder ball 150 encroaches the second copper plated layer 133, the solder ball 150 can be easily separated from the redistribution layer 130. If the thickness of the second copper plated layer 133 is greater than 4 μm, e.g., greater than 6 μm, its manufacturing costs and time may be increased.

As described above, the redistribution layer 130 comprises the first copper plated layer 131, the nickel plated layer 132 formed on the entire first copper plated layer 131, and the second copper plated layer 133 formed on the entire nickel plated layer 132. Since the nickel plated layer 132 has excellent malleability and ductility, it absorbs an external shock during a ball drop test to prevent a crack of the first copper plated layer 131 or the second copper plated layer 133. Stated another way, the nickel plated layer 132 prevents cracking of the first copper plated layer 131 and the second copper plated layer 133 from stress applied to the solder ball 150. Further, since the nickel plated layer 132 and the solder ball 150 hardly form the metal compound layer, the first copper plated layer 131 and the solder ball 150 do not respond to each other, i.e., the nickel plated layer 132 provides a barrier layer for preventing the first copper plated layer 131 from reacting with the solder ball 150.

The second insulating layer 140, sometimes called a second dielectric layer 140, having a predetermined thickness is formed on the redistribution layer 130 and the first insulating layer 120 on which the redistribution layer 130 is not formed. An opening 142 is formed in the second insulating layer 140 so that a predetermined area, sometimes called an exposed area, of the redistribution layer 130 can be exposed. The second insulating layer 140 covers the remaining area, i.e., the area other than the exposed area exposed through the opening 142, of redistribution layer 130 in order to prevent the redistribution layer 130 from being oxidized and contaminated.

The second insulating layer 140 can be formed of Polylmide (PI), Benzo Cyclo Butene (BCB), Poly Benz Oxazole (PBO), Bismaleimide Triazine (BT), phenolic resin, epoxy, Silicone (Si), silicon oxide film ($SiO_2$), silicon nitride film ($Si_3N_4$), Epoxy Mold Compound (EMC) and one selected from a group consisting of materials equivalent to those described above but the present invention is not limited thereto.

In addition, the thickness of the second insulating layer 140 can be approximately between 3~15 μm. If the thickness of the second insulating layer 140 is less than 3 μm, absorption efficiency of mechanical stress that is delivered from an external device to the solder ball 150 is reduced. Further, if the thickness of the second insulating layer 140 is greater than 15 μm, the thickness of the semiconductor device 100 excessively increases.

The solder ball 150 roughly in the shape of a sphere is welded onto the redistribution layer 130 that is externally exposed through the opening 142 of the second insulating layer 140. The solder ball 150 is used to deliver an electrical signal between the semiconductor die 110 and an external device.

The solder ball 150 can be formed of pure tin (Sn), Sn—Pb, Sn—Pb—Ag, Sn—Pb—Bi, Sn—Cu, Sn—Ag, Sn—Bi, Sn—Ag—Cu, Sn—Ag—Bi, Sn—Zn, and one selected from a group consisting of materials equivalent to those described above but the present invention is not limited thereto. Furthermore, the solder ball 150 can be doped with nickel (Ni) in order to form an optimum metal compound layer with the redistribution layer 130. The doping density of nickel (Ni) can be, e.g., approximately less than 1 wt. %.

Figure 2:
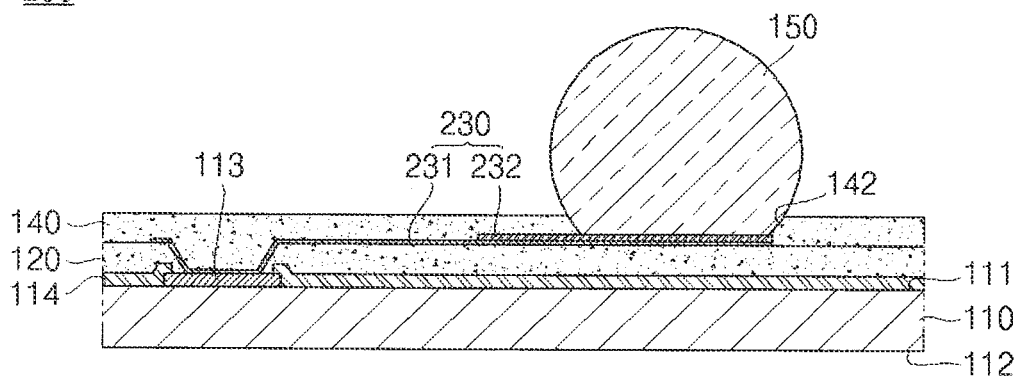
FIG. 2 is a cross-sectional view of a semiconductor device according to another embodiment of the present invention.

Referring to FIG. 2, a cross-sectional view of a semiconductor device 200 according to an embodiment of the present invention is shown.

As shown in FIG. 2, the construction of the semiconductor device 200 of the present embodiment is similar to that of the semiconductor device 100 shown in FIG. 1, except for a redistribution layer 230. Therefore, the differences therebetween will now be described.

The redistribution layer 230 of the semiconductor device 200 according to the present embodiment of the present invention comprises a copper plated layer 231, and a nickel plated layer 232 formed on a predetermined area of the copper plated layer 231. In more detail, one end of the copper plated layer 231 is electrically connected to bond pads 113 and simultaneously, another end thereof is extended in a predetermined length above the first dielectric layer 120. The nickel plated layer 232 may be formed on the copper plated layer 231 and spaced apart from the bond pads 113 (i.e., where the solder ball 150 is welded).

The copper plated layer 231 is generally plated with copper (Cu). The nickel plated layer 232 is generally plated with nickel (Ni). Further, the thickness of the copper plated layer 231 may be approximately between 1~2 μm. The thickness of the nickel plated layer 232 may be approximately between 2~4 μm.

Therefore, the nickel plated layer 232 is additionally formed on the redistribution layer 230 so that a generation degree between the solder ball 150 and the metal compound layer is quite lower than that between the solder ball 150 and the copper plated layer 131. Further, during a ball drop test, a crack that occurs in the copper plated layer 231 caused by an external shock can be prevented, which may increase reliability of hardness.

Figure 3:
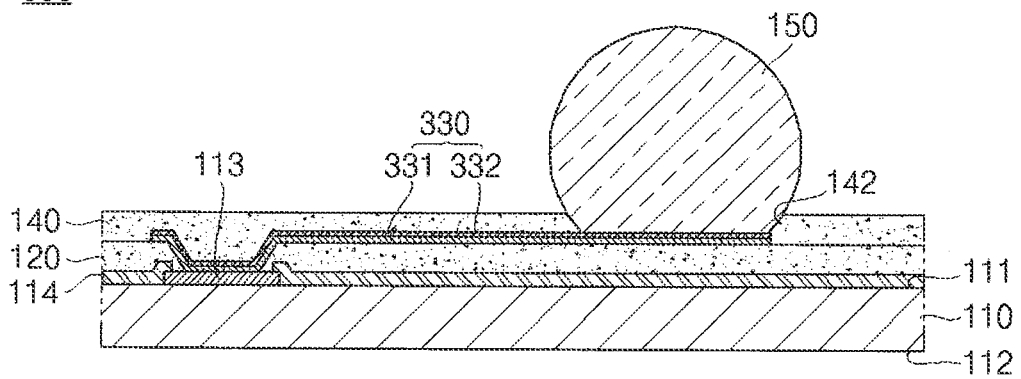
FIG. 3 is a cross-sectional view of a semiconductor device according to another embodiment of the present invention.

Referring to FIG. 3, a cross-sectional view of a semiconductor device 300 according to an embodiment of the present invention is shown.

As shown in FIG. 3, the construction of the semiconductor device 300 of the present embodiment is similar to that of the semiconductor device 100 shown in FIG. 1, except for a redistribution layer 330. Therefore, the differences therebetween will now be described.

The redistribution layer 330 of the semiconductor device 300 according to the present embodiment of the present invention comprises a nickel plated layer 331, and a copper plated layer 332 formed on a predetermined area of the nickel plated layer 331. In more detail, one end of the nickel plated layer 331 is electrically connected to the bond pads 113 and simultaneously, another end thereof is extended in a predetermined length above the first dielectric layer 120. The copper plated layer 332 may be formed on the overall surfaces of the nickel plated layer 331.

The nickel plated layer 331 may be generally formed of nickel (Ni). The thickness of the nickel plated layer 331 can be approximately between 2 and 4 μm. If the thickness of the nickel plated layer 331 is less than 2 μm, its resistance to a crack that occurs in the copper plated layer 332 is reduced. If the thickness of the nickel plated layer 331 is greater than 4 μm, it may take longer time to form the nickel plated layer 331 and manufacture the semiconductor device 300.

The copper plated layer 332 may be generally formed of copper (Cu). The thickness of the copper plated layer 332 can be approximately between 2~4 μm, which is the same as that of the nickel plated layer 331. If the thickness of the copper plated layer 332 is less than 2 μm, a metal compound layer between the copper plated layer 332 and the solder ball 150 may wholly encroach the copper plated layer 332. If the thickness of the copper plated layer 332 is greater than 4 μm, its manufacturing costs and time may be increased.

Figure 4:
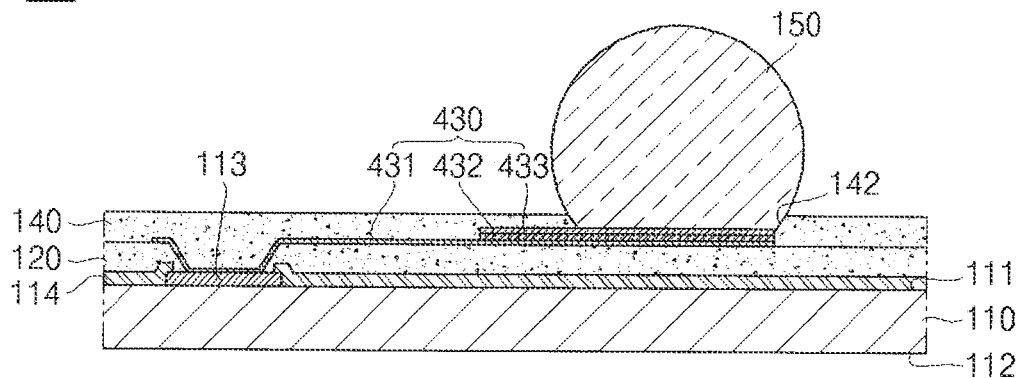
FIG. 4 is a cross-sectional view of a semiconductor device according to another embodiment of the present invention.

Referring to FIG. 4, a cross-sectional view of a semiconductor device 400 according to an embodiment of the present invention is shown.

As shown in FIG. 4, the construction of the semiconductor device 400 of the present embodiment is similar to that of the semiconductor device 100 shown in FIG. 1, except for a redistribution layer 430. Therefore, the differences therebetween will now be described.

The redistribution layer 430 of the semiconductor device 400 according to the present embodiment of the present invention comprises a first copper plated layer 431, a nickel plated layer 432 formed on the first copper plated layer 431, and a second copper plated layer 433 formed on the nickel plated layer 432.

In more detail, one end of the first copper plated layer 431 is electrically connected to the bond pads 113 and simultaneously, another end thereof is extended in a predetermined length above the first dielectric layer 120. The nickel plated layer 432 and the second copper plated layer 433 may be sequentially formed on a predetermined area of the first copper plated layer 431. That is, the nickel plated layer 432 and the second copper plated layer 433 may be spaced apart from the bond pads 113 (i.e., the redistribution layer 430 where the solder ball 150 is welded).

The first copper plated layer 431 and the second copper plated layer 433 may be generally formed of copper (Cu). The nickel plated layer 432 may be generally formed of nickel (Ni). As well known, the redistribution layers 430 are used to redistribute the peripherally formed bond pads 113 in a grid pattern.

Since the nickel plated layer 432 of the redistribution layer 430 has excellent malleability and ductility, it absorbs an external shock during a ball drop test to prevent a crack of the first copper plated layer 431 and the second copper plated layer 433.

Further, since the nickel plated layer 432 and the solder ball 150 hardly form a metal compound layer, the first copper plated layer 431 and the solder ball 150 do not respond to each other. Moreover, the redistribution layer 430 further comprises the second copper plated layer 433, making it possible to enhance reliability including bonding and hardness. The redistribution layer 430 forms the nickel plated layer 432 and the second copper plated layer 433 on predetermined areas of the first copper plated layer 431, thereby reducing production costs.

Figure 5:
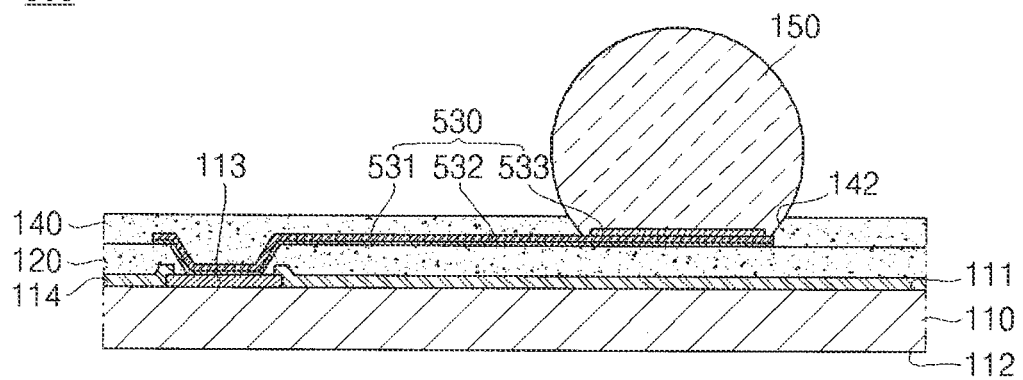
FIG. 5 is a cross-sectional view of a semiconductor device according to another embodiment of the present invention.

Referring to FIG. 5, a cross-sectional view of a semiconductor device 500 according to an embodiment of the present invention is shown.

As shown in FIG. 5, the construction of the semiconductor device 500 of the present embodiment is similar to that of the semiconductor device 100 shown in FIG. 1, except for a redistribution layer 530. Therefore, the differences therebetween will now be described.

The redistribution layer 530 of the semiconductor device 500 according to the present embodiment of the present invention comprises a first copper plated layer 531, a nickel plated layer 532 formed on the first copper plated layer 531, and a second copper plated layer 533 formed on a part of the nickel plated layer 532. In more detail, one end of the first copper plated layer 531 is electrically connected to the bond pads 113 and simultaneously, another end thereof is extended in a predetermined length above the first dielectric layer 120. The nickel plated layer 532 is formed on the whole surface of the first copper plated layer 531. The second copper plated layer 533 is formed on a predetermined area of the nickel plated layer 532. That is, the second copper plated layer 533 may be spaced apart from the bond pads 113 by a predetermined distance (i.e., the redistribution layer 530 where the solder ball 150 is welded). In other words, the second copper plated layer 533 is only formed inside an opening 142 formed in the second dielectric layer 140.

Here, when the redistribution layer 530 is bonded to the solder ball 150, the second copper plated layer 533 that is formed on the uppermost layer of the redistribution layer 530 and is externally exposed is buried by the solder ball 150. That is, the second copper plated layer 533 is exposed through the opening 142 of the second dielectric layer 140 and may be spaced from the inner circumference of the opening 142 by a predetermined distance. The solder ball 150 is welded on the second copper plated layer 533 that is exposed through the opening 142. Therefore, the second copper plated layer 533 may be bonded to be fully buried by the solder ball 150.

Therefore, the second copper plated layer 533 and the solder ball 150 are bonded to each other at edges of both ends of the second copper plated layer 533 in the inner side of the solder ball 150 along the bonding surfaces of the second copper plated layer 533 and the solder ball 150. The second copper plated layer 533 is positioned inside the solder ball 150, thereby obtaining a wide bonding area between the second copper plated layer 533 and the solder ball 150, making it possible to enhance reliability including the bonding of the solder ball 150.

Figure 6:
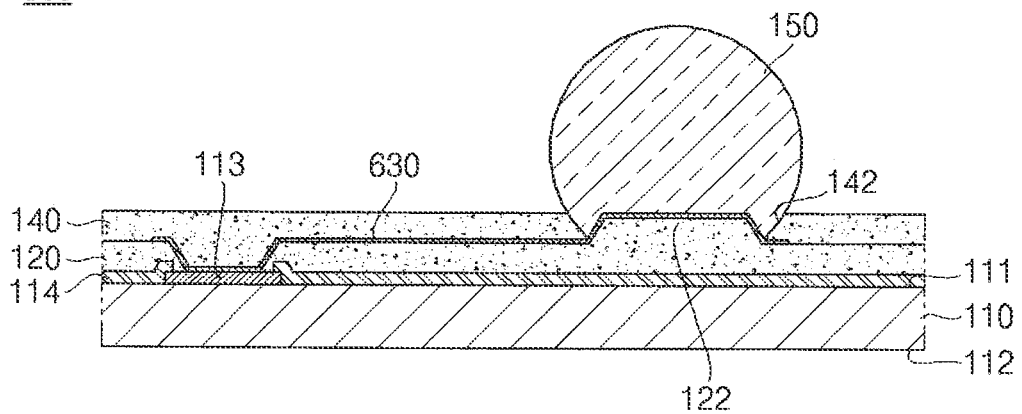
FIG. 6 is a cross-sectional view of a semiconductor device according to another embodiment of the present invention.

Referring to FIG. 6, a cross-sectional view of a semiconductor device 600 according to an embodiment of the present invention is shown.

As shown in FIG. 6, the construction of the semiconductor device 600 of the present embodiment is similar to that of the semiconductor device 100 shown in FIG. 1, except for a redistribution layer 630. Therefore, the differences therebetween will now be described.

The redistribution layer 630 of the semiconductor device 600 according to the present embodiment of the present invention is merely plated with copper (Cu). One end of the redistribution layer 630 is electrically connected to the bond pads 113 and simultaneously, another end thereof is extended in a predetermined length above the first dielectric layer 120. As described above, the redistribution layer 630 is used to redistribute the peripheral bond pads 113 in a grid pattern.

Here, a predetermined area of the redistribution layer 630 is upward projected through a projection 122 formed in the first dielectric layer 120. Moreover, the projection 122 may be spaced apart from the bond pads 113 by a predetermined distance (i.e., where the solder ball 150 is welded). Further, the redistribution layer 630 formed on the projection 122 may be externally exposed through the opening 142 of the second dielectric layer 140.

Thus, when the solder ball 150 is bonded to the redistribution layer 630 formed on the projection 122, a bonding area between interfaces of the redistribution layer 630 and the solder ball 150 is extended, thereby increasing bonding power of the solder ball 150.

The thickness of the redistribution layer 630 can be approximately between 5~15 μm. If the thickness of the redistribution layer 630 is less than 5 μm, the solder ball 150 that is welded to the redistribution layer 630 can be easily separated therefrom. In more detail, a metal compound layer between the redistribution layer 630 and the solder ball 150 generally has a thickness of 3~5 μm. If the thickness of the redistribution layer 630 is less than 5 μm, the metal compound layer can directly contact the first dielectric layer 120, which remarkably reduces adhesive strength of the solder ball 150. Therefore, the solder ball 150 can be easily separated from the redistribution layer 630. Further, if the thickness of the redistribution layer 630 is greater than 15 μm, it takes much time to manufacture the semiconductor device 600. In more detail, an electroplating process is used to form the redistribution layer 630 so that it takes much time to perform the electroplating process in order to form the redistribution layer 630 having the thickness greater than 15 μm.

Figure 7:
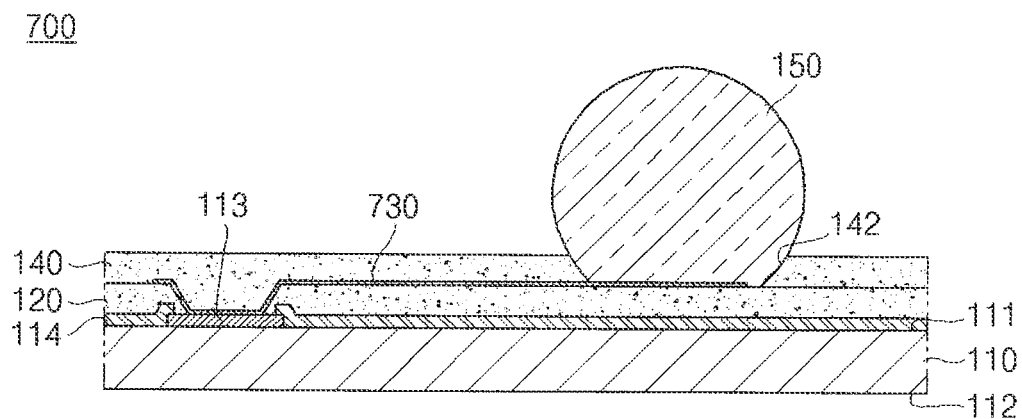
FIG. 7 is a cross-sectional view of a semiconductor device according to another embodiment of the present invention.

Referring to FIG. 7, a cross-sectional view of a semiconductor device 700 according to an embodiment of the present invention is shown.

As shown in FIG. 7, the construction of the semiconductor device 700 of the present embodiment is similar to that of the semiconductor device 100 shown in FIG. 1, except for a redistribution layer 730. Therefore, the differences therebetween will now be described.

The redistribution layer 730 of the semiconductor device. 700 according to the present embodiment of the present invention is merely plated with copper (Cu). One end of the redistribution layer 730 is electrically connected to the bond pads 113 and simultaneously, another end thereof is extended in a predetermined length above the first dielectric layer 120. As described above, the redistribution layer 730 is used to redistribute the peripheral bond pads 113 in a grid pattern.

Here, the redistribution layer 730 is exposed through the opening 142 formed in a predetermined area of the second dielectric layer 140. The redistribution layer 730 is exposed where the opening 142 of the second dielectric layer 140 is spaced apart from the bond pads 113 (i.e., where the solder ball 150 is welded to the redistribution layer 730).

The redistribution layer 730 is spaced apart from one side of the opening 142 of the second dielectric layer 140 by a predetermined distance, so that an area of the first dielectric layer 120 formed in the lower part of the redistribution layer 730 is externally exposed through the opening 142 of the second dielectric layer 140. The redistribution layer 730 will be described in detail with reference to the other drawings.

The thickness of the redistribution layer 730 is the same as that of the redistribution layer 630 shown in FIG. 6. Thus, the thickness of the redistribution layer 730 is not repeated.

Figure 8:
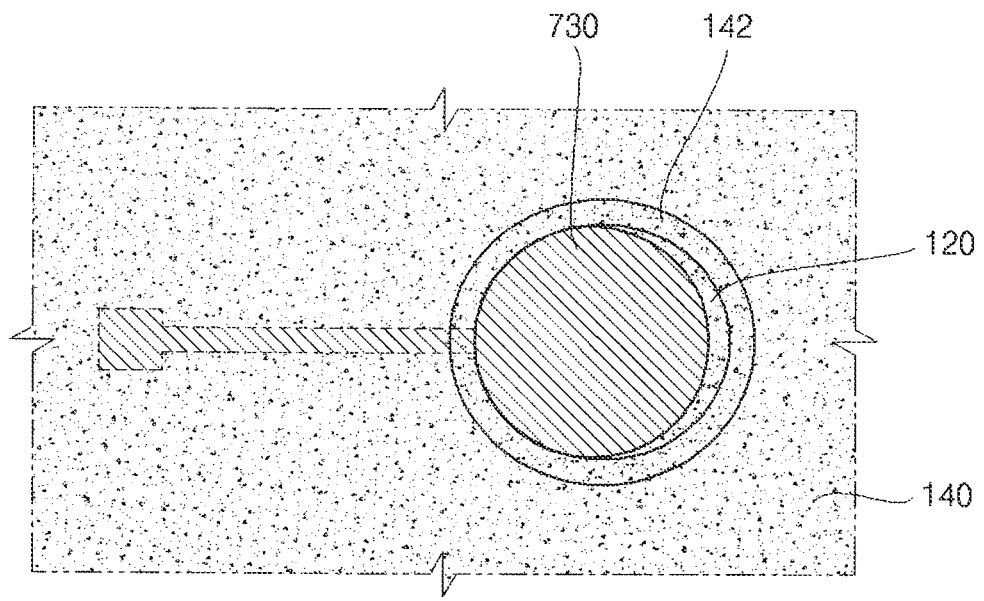
FIG. 8 is a plan view of the semiconductor device shown in FIG. 7.

Referring to FIG. 8, a plan view for explaining an arrangement of the redistribution layer 730 of the semiconductor device 700 shown in FIG. 7 is illustrated.

As shown in FIG. 8, the redistribution layer 730 of the semiconductor device 700 is formed inside the opening 142 of the second dielectric layer 140. A predetermined area of the first dielectric layer 120 is externally exposed at an area of one side of the redistribution layer 730 and the opening 142.

Thus, when the solder ball 150 is welded to the redistribution layer 730, the solder ball 150 may be welded to the first dielectric layer 120 exposed between the redistribution layer 730 and the opening 142 of the second dielectric layer 140. Therefore, bonding between the redistribution layer 730 and the solder ball 150 can be enhanced. That is, the redistribution layer 730 and the solder ball 150 are bonded to each other at edges of the redistribution layer 730 in the inner side of the solder ball 150 along the bonding surfaces of the redistribution layer 730 and the solder ball 150.

The redistribution layer 730 is located inside the solder ball 150, which prevents crack and uniformity phenomena. Further, a bonding area between the redistribution layer 730 and the solder ball 150 can increase and a board level reliability including bonding can enhance.

Figure 9:
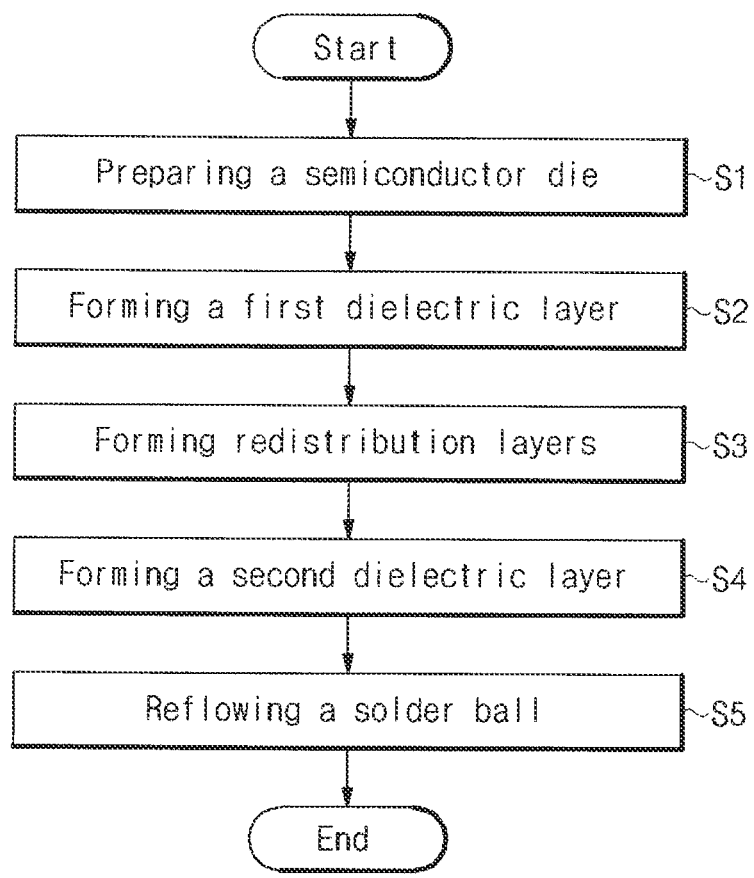
FIG. 9 is a flowchart illustrating a method of manufacturing a semiconductor device according to an embodiment of the present invention.

Referring to FIG. 9, a flowchart illustrating a method of manufacturing a semiconductor device according to an embodiment of the present invention is shown.

As shown in FIG. 9, the method of manufacturing the semiconductor device of the present embodiment comprises preparing a semiconductor die operation (S1) forming a first dielectric layer operation (S2), forming redistribution layers operation (S3), forming a second dielectric layer operation (S4), and ref lowing a solder ball operation (S5).

Referring to FIGS. 10A through 10E, cross-sectional views of the step-by-step method of manufacturing the semiconductor device shown in FIG. 9 are shown.

Figure 10A:
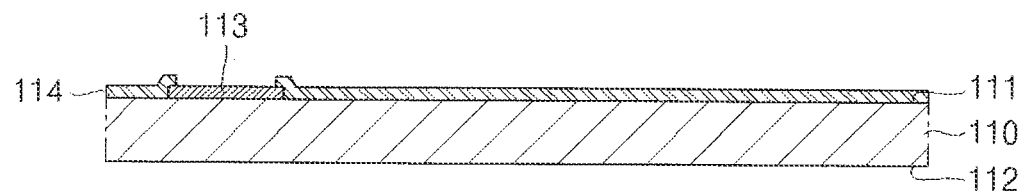
FIGS. 10A through 10E are cross-sectional views of the step-by-step method of manufacturing the semiconductor device shown in FIG. 9.

As shown in FIG. 10A, in the preparing a semiconductor die operation (S1), the semiconductor die 110 having a roughly flat first surface 111 and a roughly flat second surface 112 on the opposite side of the first surface 111 on which at least one bond pad 113 is formed is prepared. A passivation layer 114 is formed on the first surface 111 excluding the bond pad 113.

Figure 10B:
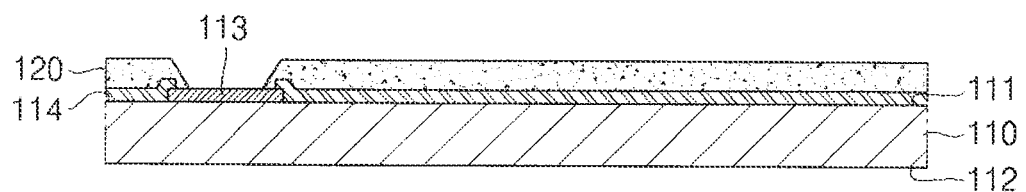

As shown in FIG. 10B, in the forming a first dielectric layer operation (S2), the first dielectric layer 120 having a predetermined thickness is formed on the passivation layer 114 that is a circumferential surface of the bond pad 113.

For example, the first dielectric layer 120 having the predetermined thickness is formed by spin coating, screen printing, or dispensing the first dielectric layer 120 in the form of liquid on the bond pad 113 and the passivation layer 114 and hardening the first dielectric layer 120. Thereafter, the bond pad 113 is externally exposed through the first dielectric layer 120 by an exposure and developing process.

Figure 10C:
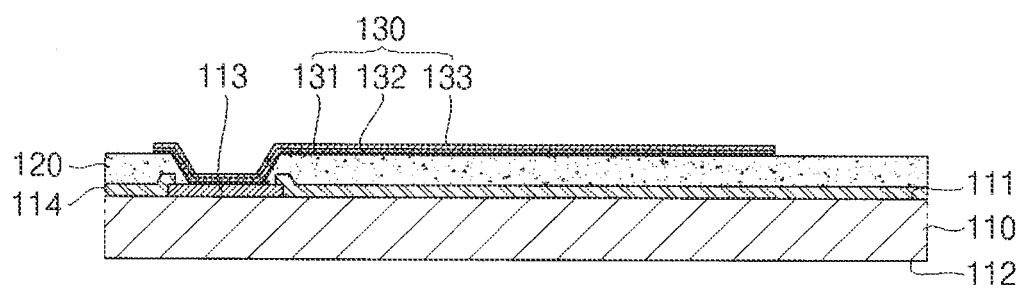

As shown in FIG. 10C, in the forming redistribution layers operation (S3), the redistribution layers 130 are formed by sequentially forming the first copper plated layer 131, the nickel plated layer 132, and the second copper plated layer 133.

After forming a photo resist above the bond pads 113 and the first dielectric layer 120, an area where the redistribution layers 130 are formed is defined by hardening, exposure, and developing process. The redistribution layers 130 having a predetermined thickness are formed on the first dielectric layer 120 using the photo resist. Thus, the redistribution layers 130 can sequentially form the first copper plated layer 131, the nickel, plated layer 132, and the second copper plated layer 133 each having a predetermined length.

Here, the thickness of the first copper plated layer 131 may be approximately 2~4 μm, the thickness of the nickel plated layer 132 may be approximately 2~4 μm, and the thickness of the second copper plated layer 133 may be approximately 1~2 μm. Thereafter, the unnecessary photo resist located outside the redistribution layer 130 is completely etched and removed.

Figure 10D:
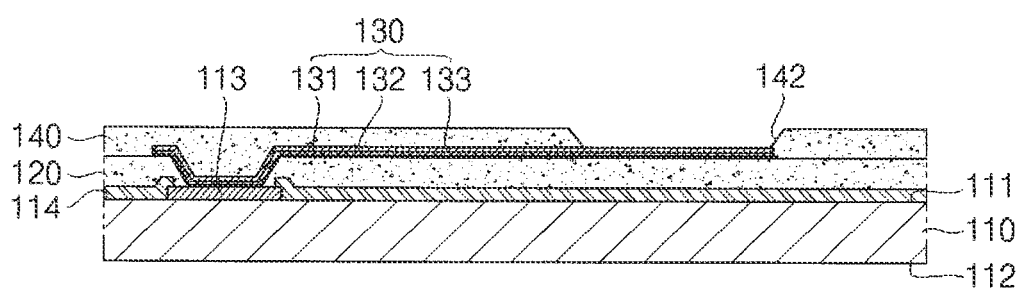

As shown in FIG. 10D, in the forming a second dielectric layer operation (S4), the second dielectric layer 140 having a predetermined thickness is formed on the redistribution layers 130 and the first dielectric layer 120.

For example, the second dielectric layer 140 having the predetermined thickness is formed by spin coating, screen printing, or dispensing the second dielectric layer 140 in the form of liquid on the redistribution layers 130 and the first dielectric layer 120 and hardening the second dielectric layer 140. Thereafter, an area of the redistribution layers 130 to which a solder ball is welded is externally exposed during an exposure and developing process. That is, an opening 142 is formed in an area of the second insulting layer 140 to which the solder ball is welded.

Figure 10E:
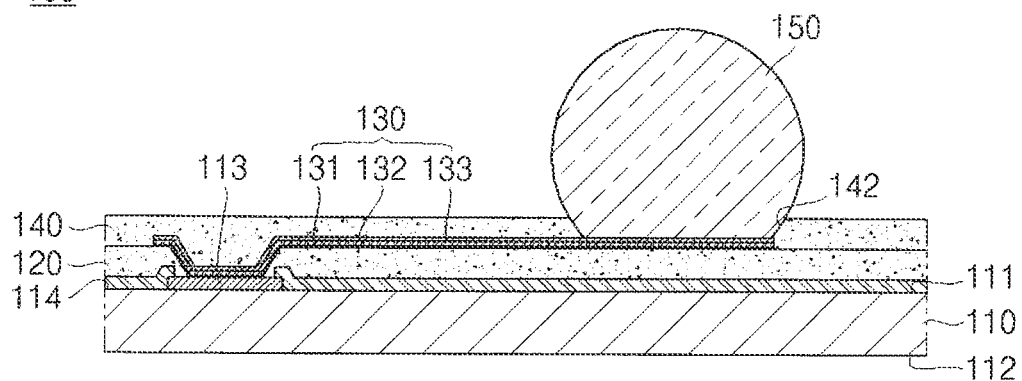

As shown in FIG. 10E, in the reflowing a solder ball operation (S5), the solder ball 150 having a predetermined diameter is reflowed to the area of the redistribution layers 130 that is exposed through the opening 142 formed in the second dielectric layer 140.

For example, the area of the redistribution layers 130 that is exposed through the opening 142 is coated with viscous flux and then the solder ball 150 is disposed on the flux. Thereafter, the semiconductor die 110 is put into a furnace at the temperature of 150~250° C. so that the flux is volatilized and the solder ball 150 in the shape of a sphere is welded to the redistribution layers 130. The solder ball 150 can be generally a solder alloy, and can be doped with nickel (Ni) in order to form an optimum metal compound layer but the present invention is not limited thereto.

Referring to FIGS. 11A through 11E, cross-sectional views of the step-by-step method of manufacturing the semiconductor device shown in FIG. 2 are shown.

As shown in FIGS. 11A through 11E, the method of manufacturing the semiconductor device 200 shown in FIG. 2 of the present embodiment is similar to that of manufacturing the semiconductor device 100 shown in FIGS. 10A through 10E, except for the forming redistribution layers operation (S3) shown in FIG. 10C. Therefore, the differences therebetween will now be described.

Figure 11A:
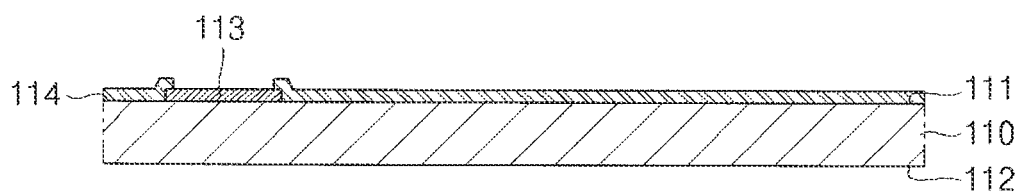
FIGS. 11A through 11E are cross-sectional views of the step-by-step method of manufacturing the semiconductor device according to an embodiment of the present invention.
Figure 11B:
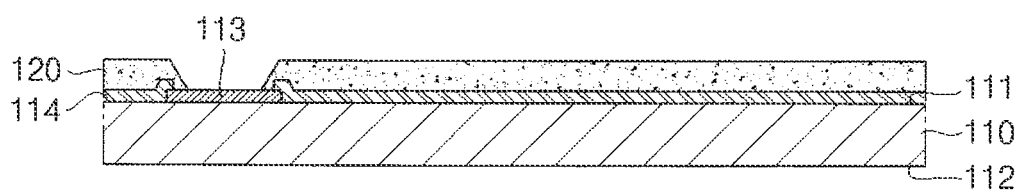
Figure 11C:
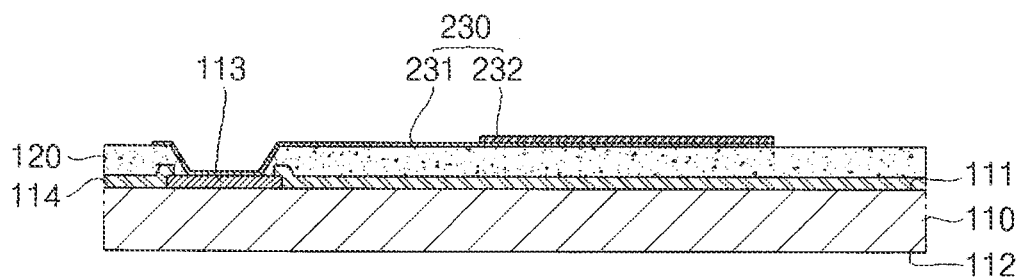
Figure 11D:
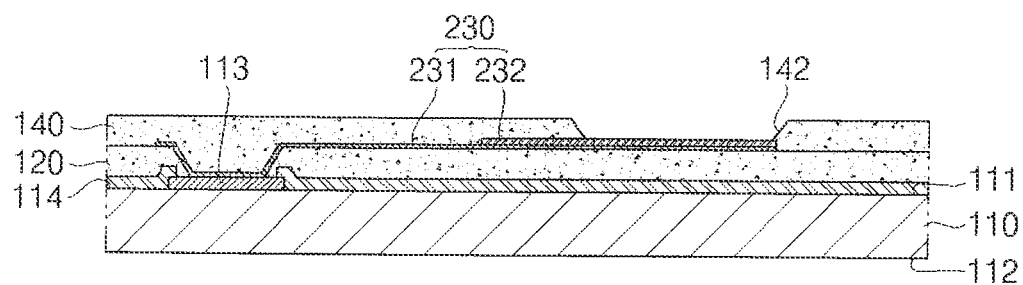
Figure 11E:
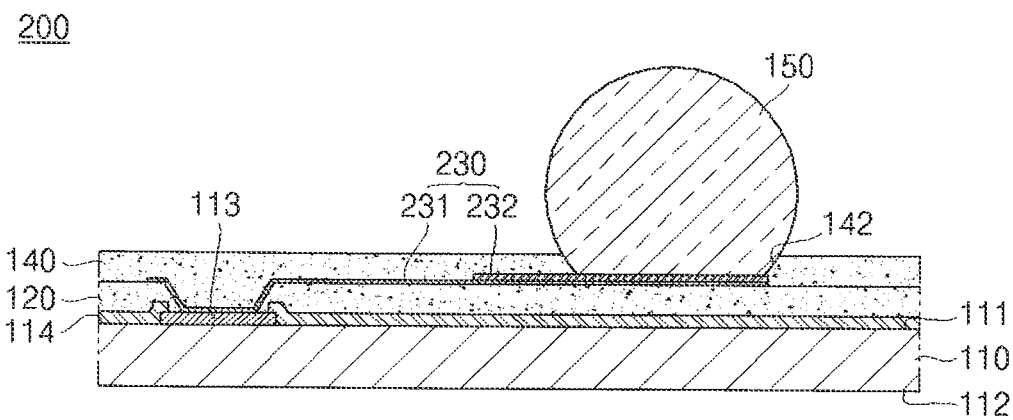

Referring to FIG. 11C, in the forming redistribution layers operation (S3), the copper plated layer 231 and the nickel plated layer 232 are sequentially plated to form the redistribution layer 230.

After coating a photo resist on the bond pads 113 and the first dielectric layer 120, the copper plated layer 231 having a predetermined thickness is formed by hardening, exposure, and developing process. The thickness of the copper plated layer 231 may be approximately 2~4 μm. Thereafter, the unnecessary photo resist located outside the copper plated layer 231 is completely etched and removed.

After coating a photo resist on the copper plated layer 231 that is spaced apart from the bond pads 113 by a predetermined distance where the solder ball 150 is welded), the nickel plated layer 232 is formed by hardening, exposure, and developing process. The thickness of the nickel plated layer 232 may be approximately 1~2 μm. Thereafter, the unnecessary photo resist located outside the nickel plated layer 232 is completely etched and removed.

Referring to FIGS. 12A through 12E, cross-sectional views of the step-by-step method of manufacturing the semiconductor device shown in FIG. 3 are shown.

As shown in FIGS. 12A through 12E, the method of manufacturing the semiconductor device 300 shown in FIG. 3 of the present embodiment is similar to that of manufacturing the semiconductor device 100 shown in FIGS. 10A through 10E, except for the forming redistribution layers operation (S3) shown in FIG. 10C. Therefore, the differences therebetween will now be described.

Figure 12A:
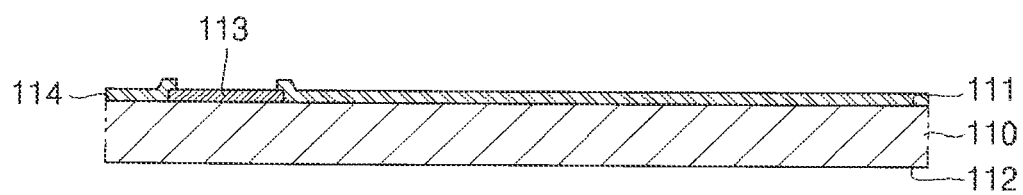
FIGS. 12A through 12E are cross-sectional views of the step-by-step method of manufacturing the semiconductor device according to another embodiment of the present invention.
Figure 12B:
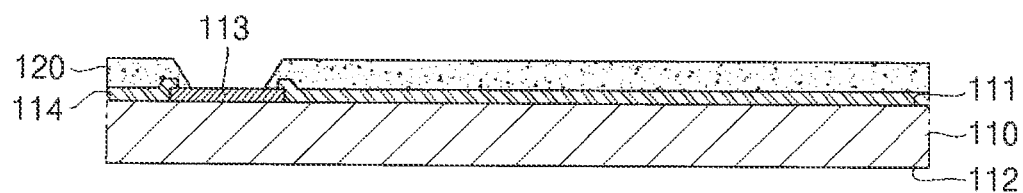
Figure 12C:
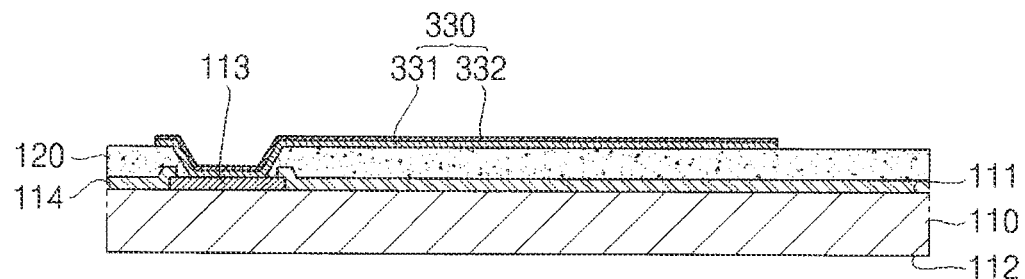
Figure 12D:
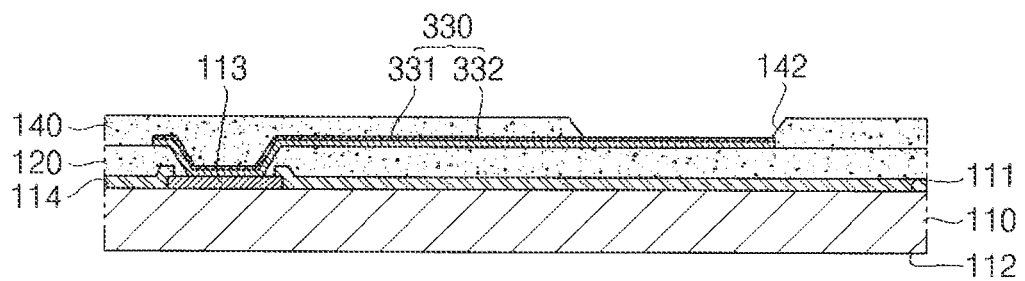
Figure 12E:
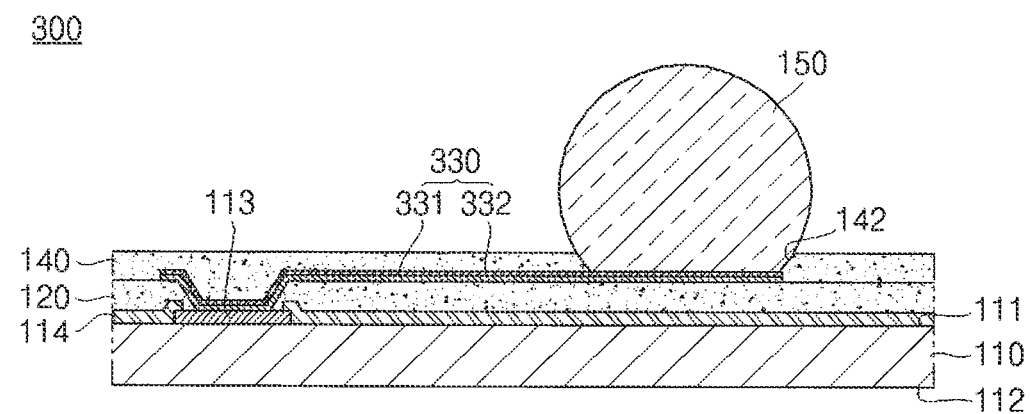

Referring to FIG. 12C, in the forming redistribution layers operation (S3), the nickel plated layer 331 and the copper plated layer 332 are sequentially plated to form the redistribution layer 330.

After coating a photo resist on the bond pads 113 and the first dielectric layer 120 extending to a predetermined length, the nickel plated layer 331 having a predetermined thickness is formed by hardening, exposure, and developing process, and then the copper plated layer 332 is formed on the nickel plated layer 331. The thickness of the nickel plated layer 331 and the copper plated layer 332 may be approximately 2~4 μm. Thereafter, the unnecessary' photo resist located outside the nickel plated layer 331 and the copper plated layer 332 is completely etched and removed.

Referring to FIGS. 13A through 13E, cross-sectional views of the step-by-step method of manufacturing the semiconductor device shown in FIG. 4 are shown.

As shown in FIGS. 13A through 13E, the method of manufacturing the semiconductor device 400 shown in FIG. 4 of the present embodiment is similar to that of manufacturing the semiconductor device 100 shown in FIGS. 10A through 10E, except for the forming redistribution layers operation (S3) shown in FIG. 10C. Therefore, the differences therebetween will now be described.

Figure 13A:
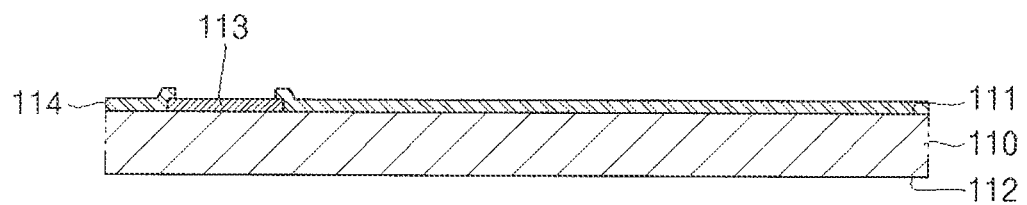
FIGS. 13A through 13E are cross-sectional views of the step-by-step method of manufacturing the semiconductor device according to another embodiment of the present invention.
Figure 13B:
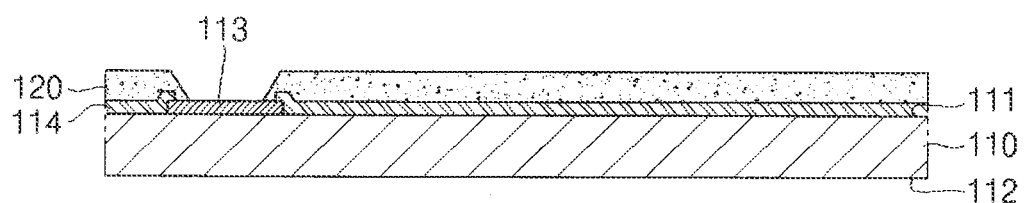
Figure 13C:
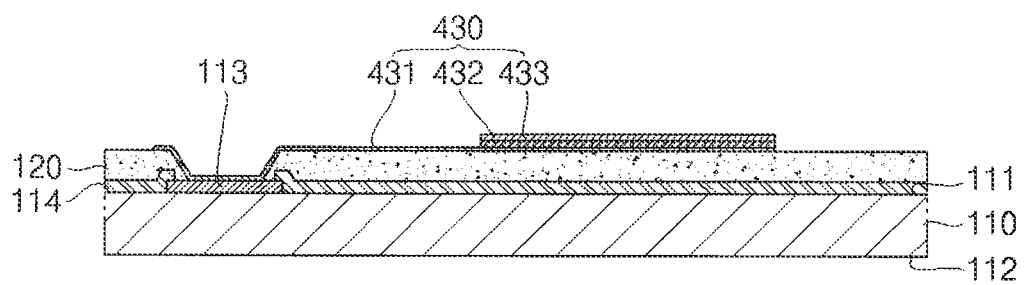
Figure 13D:
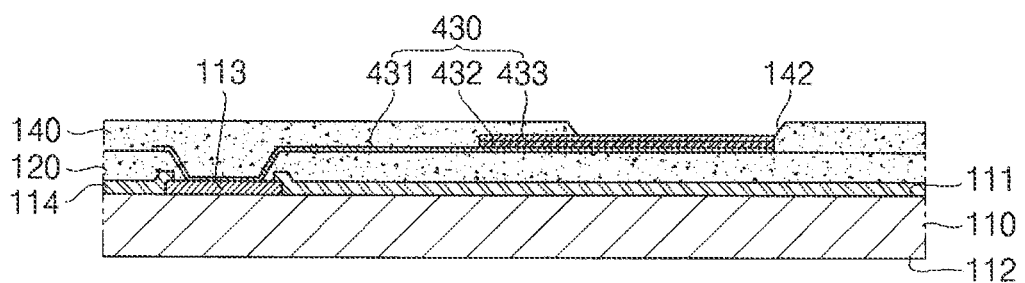
Figure 13E:
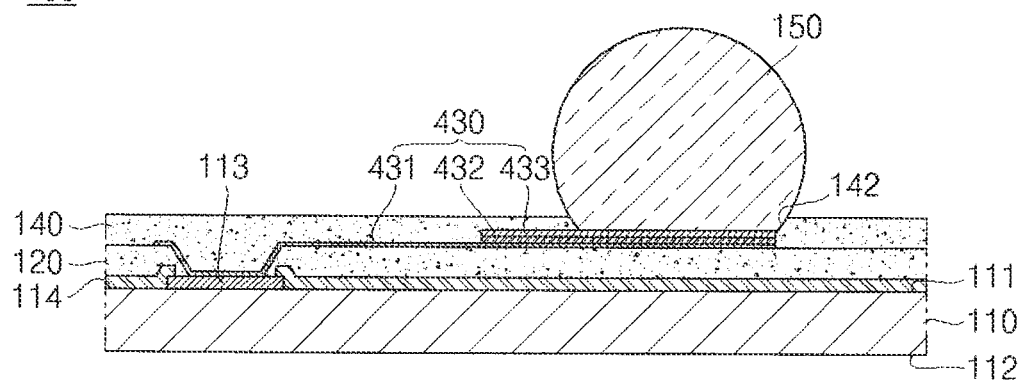

Referring to FIG. 13C, in the forming redistribution layers operation (S3), the first copper plated layer 431, the nickel plated layer 432, and the second plated layer 433 are sequentially plated to form the redistribution layer 430.

After coating a photo resist on a predetermined area of the bond pads 113 and the first dielectric layer 120, the first copper plated layer 431 having a predetermined thickness is formed by hardening, exposure, and developing process. The thickness of the first copper plated layer 431 may be approximately 1~2 μm. Thereafter, the unnecessary photo resist located outside the first copper plated layer 431 is completely etched and removed.

After coating a photo resist on a predetermined area of the first copper plated layer 431, i.e. a location spaced apart from the bond pads 113 by a predetermined distance, the nickel plated layer 432 and the second plated layer 433 having a predetermined thickness is formed by hardening, exposure, and developing process. The thickness of the nickel plated layer 432, and the second plated layer 433 may be approximately 2~4 μm, respectively. Thereafter, the unnecessary photo resist located outside the nickel plated layer 432 and the second plated layer 433 is completely etched and removed.

Referring to FIGS. 14A through 14E, cross-sectional views of the step-by-step method of manufacturing the semiconductor device shown in FIG. 5 are shown.

As shown in FIGS. 14A through 14E, the method of manufacturing the semiconductor device 500 shown in FIG. 5 of the present embodiment is similar to that of manufacturing the semiconductor device 100 shown in FIGS. 10A through 10E, except for the forming redistribution layers operation (S3) shown in FIG. 10C. Therefore, the differences therebetween will now be described.

Figure 14A:
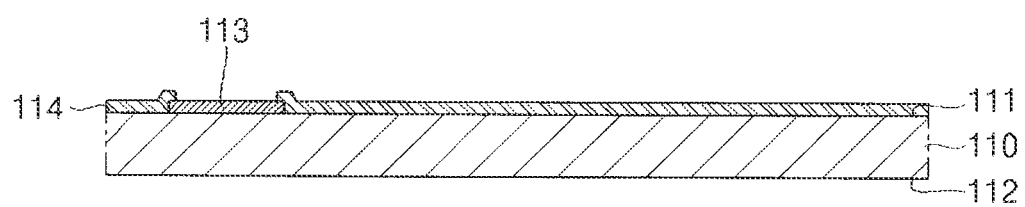
FIGS. 14A through 14E are cross-sectional views of the step-by-step method of manufacturing the semiconductor device according to another embodiment of the present invention.
Figure 14B:
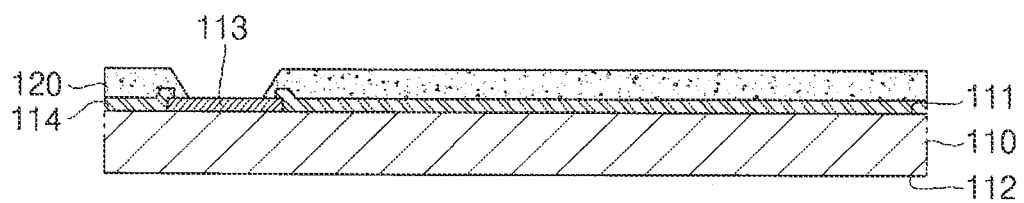
Figure 14C:
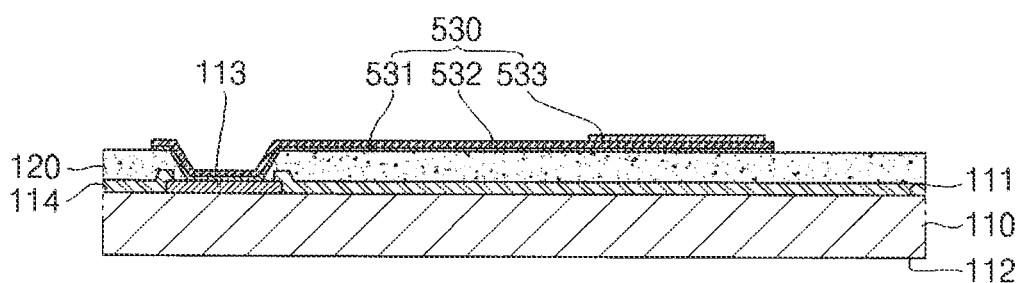
Figure 14D:
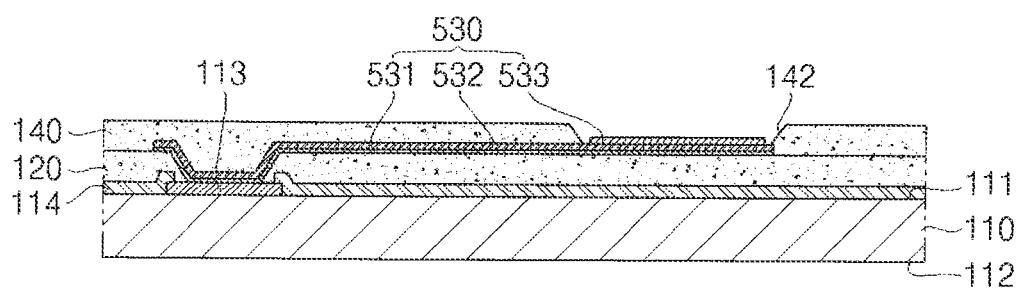
Figure 14E:
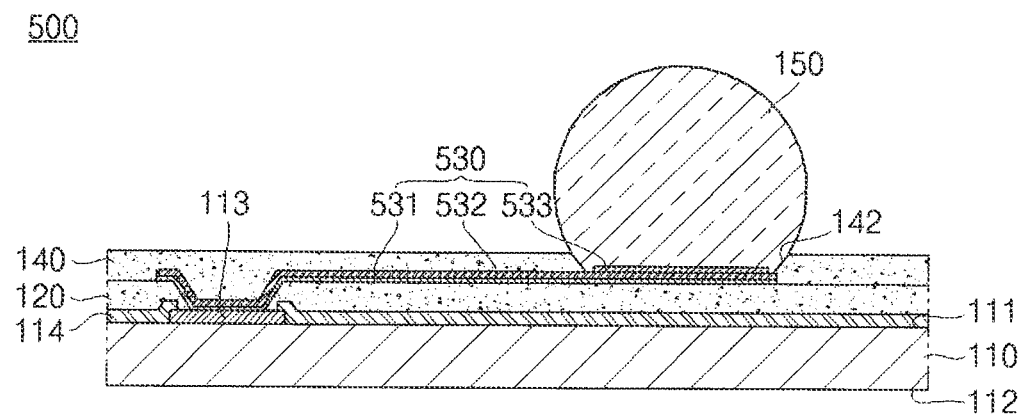

Referring to FIG. 14C, in the forming redistribution layers operation (S3), the first copper plated layer 531, the nickel plated layer 532, and the second plated layer 533 are sequentially plated to form the redistribution layer 530.

After coating a photo resist on a predetermined area of the bond pads 113 and the first dielectric layer 120, the first copper plated layer 531 and the nickel plated layer 532 are formed by hardening, exposure, and developing process. The thickness of the first copper plated layer 531 may be approximately 1~2 μm. The thickness of the nickel plated layer 532 may be approximately 2~4 μm. Thereafter, the unnecessary photo resist located outside the first copper plated layer 531 and the nickel plated layer 532 is completely etched and removed.

After coating a photo resist on a predetermined area of the first copper plated layer 531, i.e. a location spaced apart from the bond pads 113 by a predetermined distance, the second plated layer 533 having a predetermined thickness is formed by hardening, exposure, and developing process. The thickness of the second plated layer 533 may be approximately 2~4 μm. Thereafter, the unnecessary photo resist located outside the second plated layer 533 is completely etched and removed.

Here, the second plated layer 533 may be spaced, by a predetermined distance, apart from the inner circumference of the opening 142 of the second dielectric layer 140 that is to be formed later. When the solder ball 150 is welded to the second copper plated layer 533, the second copper plated layer 533 and the solder ball 150 are bonded to each other at edges of both ends of the second copper plated layer 533 in the inner side of the solder ball 150 along the bonding surfaces of the second copper plated layer 533 and the solder ball 150. Thus, the second copper plated layer 533 is positioned inside the solder ball 150, thereby obtaining a wide bonding area between the second copper plated layer 533 and the solder hall 150.

Referring to FIGS. 15A through 15E, cross-sectional views of the step-by-step method of manufacturing the semiconductor device shown in FIG. 6 are shown.

As shown in FIGS. 15A through 15E, the method of manufacturing the semiconductor device 600 shown in FIG. 6 of the present embodiment is similar to that of manufacturing the semiconductor device 100 shown in FIGS. 10A through 10E, except for the forming a first dielectric layer operation (S2) and the forming redistribution layers operation (S3). Therefore, the differences therebetween will now be described.

Referring to FIG. 15S, in the forming first dielectric layer operation (S2), the first dielectric layer 120 having a predetermined thickness is formed on the passivation layer 114 that is a circumferential surface of the bond pad 113. Thereafter, the bond pad 113 is externally exposed through the first dielectric layer 120 by an exposure and developing process.

At this time, the projection 122 having a predetermined thickness may be further outwardly formed on a predetermined area of the first dielectric layer 120, i.e., a location spaced apart from the bond pads 113 by a predetermined distance. The projection 122 may be formed by coating photo resist and etching or adding the photo resist by hardening, exposure, and developing process. A method of forming the projection 122 by using the etching or adding process will be described in detail with reference to the other drawings.

Referring to FIG. 15O, in the forming redistribution layers operation (S3), the redistribution layers 630 may be generally formed of copper (Cu). The redistribution layers 630 are plated with copper having a predetermined, thickness by coating a photo resist by hardening, exposure, and developing process so that the redistribution layers 630 can be extended to the bond pads 113 and the first dielectric layer 120. The redistribution layers 630 are formed above the projection 122 according to the shape of the projection 122 of the first dielectric layer 120. Further, the thickness of the redistribution layers 630 may be approximately 5~15 μm. Thereafter, the unnecessary photo resist located outside the redistribution layers 630 is completely etched and removed.

Figure 15A:
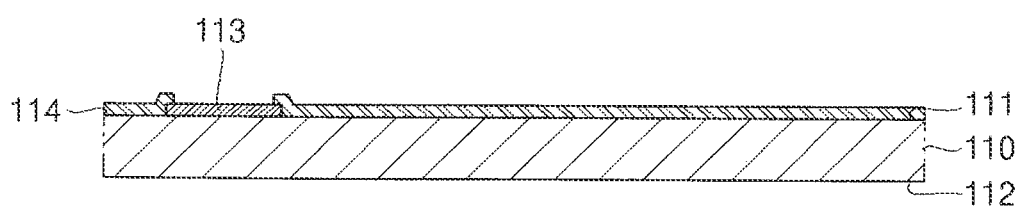
FIGS. 15A through 15E are cross-sectional views of the step-by-step method of manufacturing the semiconductor device according to another embodiment of the present invention.
Figure 15B:
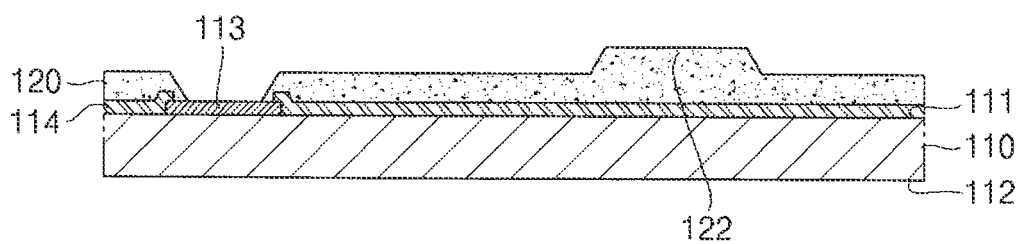
Figure 15C:
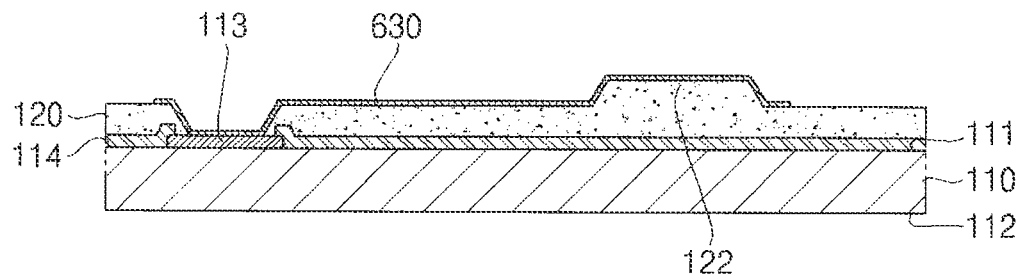
Figure 15D:
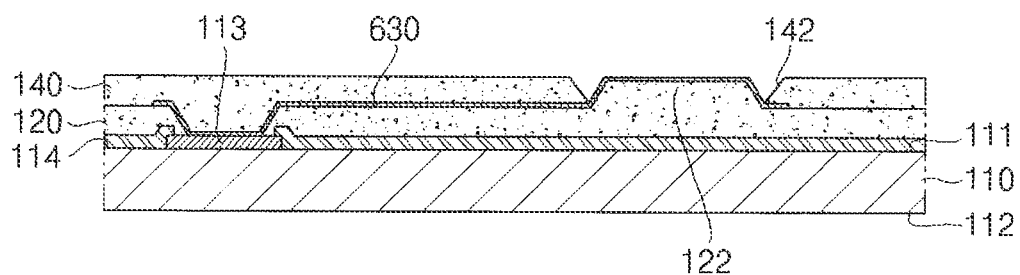
Figure 15E:
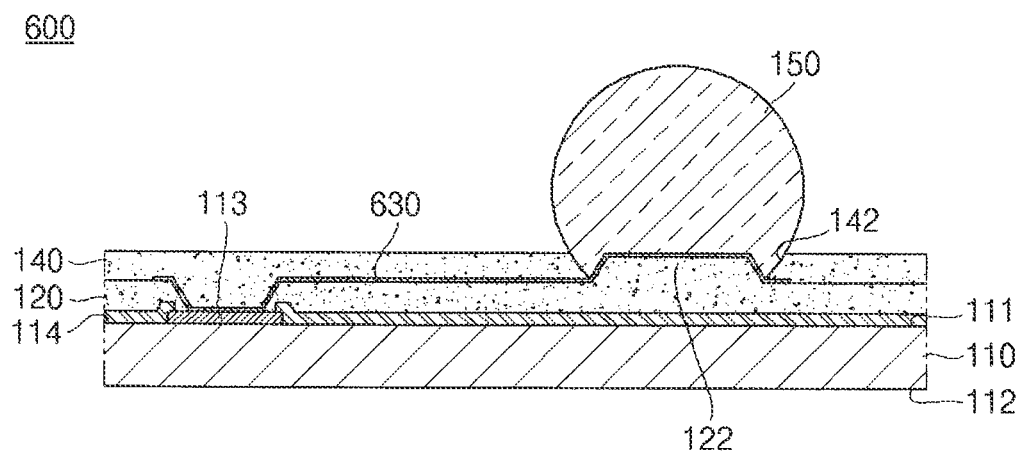
Figure 16A:
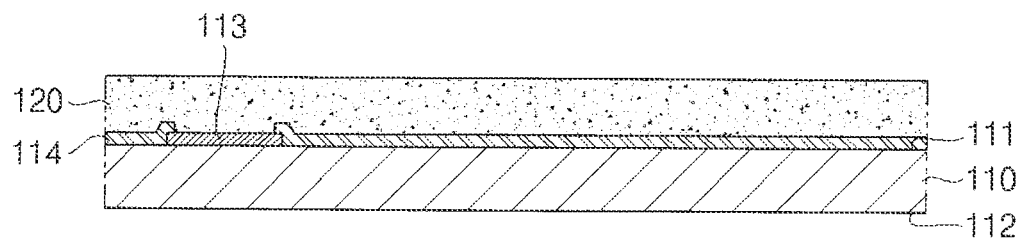
FIGS. 16A through 16C are cross-sectional views of a step-by-step method of forming a projection of a first dielectric layer shown in FIG. 15B according to an embodiment of the present invention.
Figure 16B:
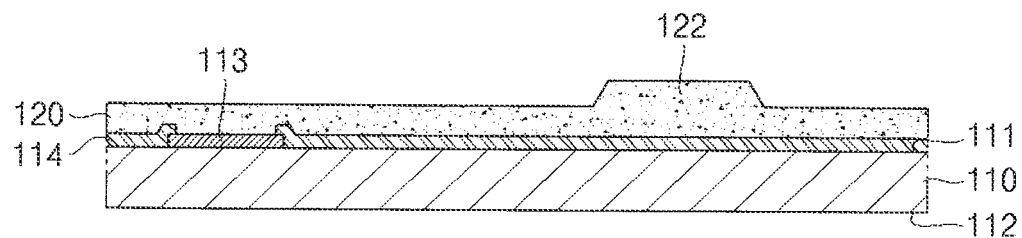
Figure 16C:
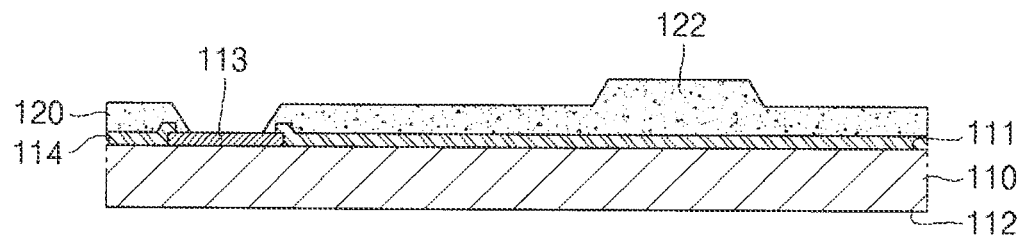

Referring to FIGS. 16A through 16C, cross-sectional views of the step-by-step method of manufacturing the projection 122 of the first dielectric layer 120 shown in FIG. 15B using an etching process are shown.

Referring to FIG. 16A, the first dielectric layer 120 having a predetermined thickness is formed on the bond pads 113 and the passivation layer 114. The first dielectric layer 120 having the predetermined thickness is formed by spin coating, screen printing, or dispensing the first dielectric layer 120 in the form of liquid on the bond pad 113 and the passivation layer 114 and hardening the first dielectric layer 120.

Thereafter, referring to FIG. 16B, the other areas of the first dielectric layer 120 having a predetermined thickness are removed by the etching process, except for a predetermined area thereof (i.e., location spaced apart from the bond pads 113 by a predetermined distance), so that the projection 122 is formed on the predetermined area of the first dielectric layer 120. The projection 122 can be formed on the first dielectric layer 120 and spaced apart from the bond pads 113 by a predetermined distance.

Finally, referring to FIG. 16C, the first dielectric layer 120 formed on the bond pads 113 is etched and removed so that the surfaces of the bond pads 113 can be externally exposed via the first dielectric layer 120.

Referring to FIGS. 17A through 17E, cross sectional views of the step-by-step method of manufacturing the projection 122 of the first dielectric layer 120 shown in FIG. 15S using an adding process are shown.

Figure 17A:
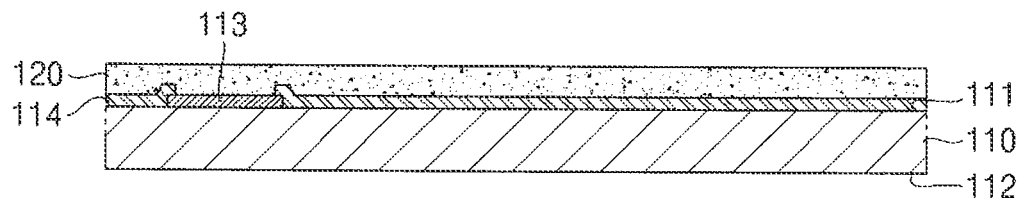
FIGS. 17A through 17E are cross-sectional views of a step-by-step method of forming the projection of the first dielectric layer shown in FIG. 15B according to another embodiment of the present invention.
Figure 17B:
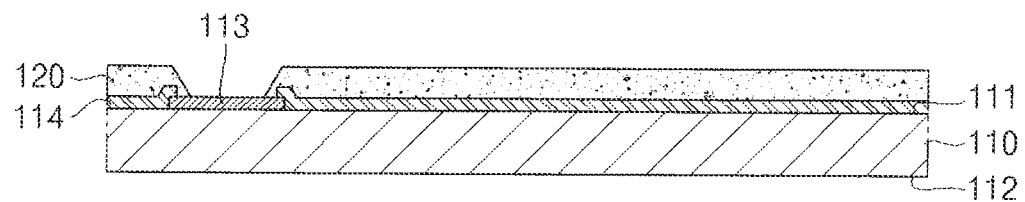

Referring to FIG. 17A, the first dielectric layer 120 having a predetermined thickness is formed on the bond pads 113 and the passivation layer 114. The first dielectric layer 120 having the predetermined thickness is formed by spin coating, screen printing, or dispensing the first dielectric layer 120 in the form of liquid on the bond pad 113 and the passivation layer 114 and hardening the first dielectric layer 120.

Thereafter, referring to FIG. 17S, the first dielectric layer 120 formed on the bond pads 113 is etched by a photo process (mask/exposure/developing) so that the bond pads 113 can be externally exposed via the first dielectric layer 120.

Figure 17C:
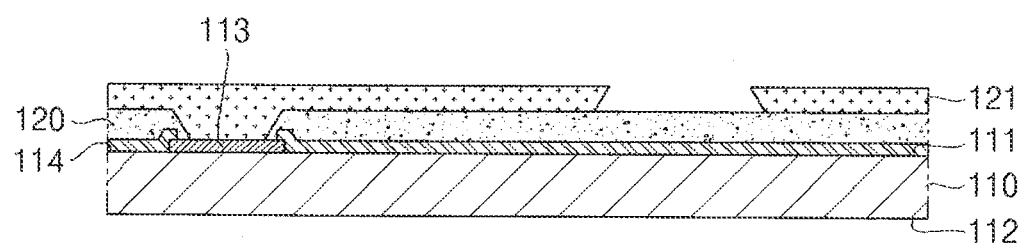

Thereafter, referring to FIG. 17C, a photo resist layer 121 is coated on the other areas of the bond pads 113 and the first dielectric layer 120, except for a location spaced apart from the bond pads 113 by a predetermined distance. For example, after forming a photo resist layer above the bond pads 113 and the first dielectric layer 120, an area spaced apart from the bond pads 113 above the first dielectric layer 120 is defined by hardening, exposure, and developing process.

Figure 17D:
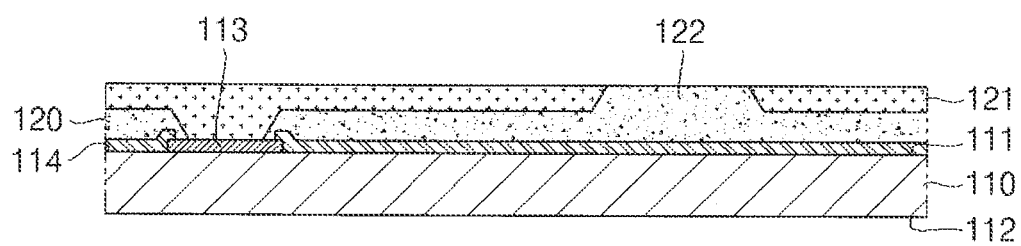

Thereafter, referring to FIG. 17D, the first dielectric layer 120 is formed on the first dielectric layer 120 where the photo resist layer 121 is not formed. In more detail, the first dielectric layer 120 is added to the area where the photo resist layer 121 is not formed by the surface of the photo resist layer 121. Thus, the projection 122 of which part is projected from the first dielectric layer 120 may be formed in the area where the photo resist layer 121 is not formed.

Figure 17E:
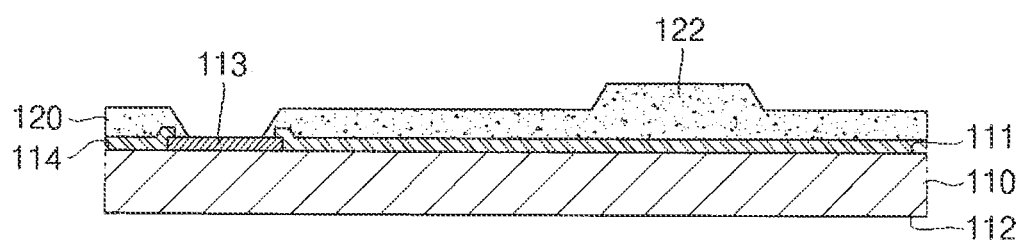

Finally, referring to FIG. 17E, the photo resist layer 121 formed on the bond pads 113 and the first dielectric layer 120 is etched and removed.

Referring to FIGS. 18A through 18E, cross-sectional views of the step-by-step method of manufacturing the semiconductor device shown in FIG. 7 are shown.

As shown in FIGS. 18A through 18E, the method of manufacturing the semiconductor device 700 shown in FIG. 7 of the present embodiment is similar to that of manufacturing the semiconductor device 100 shown in FIGS. 10A through 10E, except for the forming redistribution layers operation (S3). Therefore, the differences therebetween will now be described.

Figure 18A:
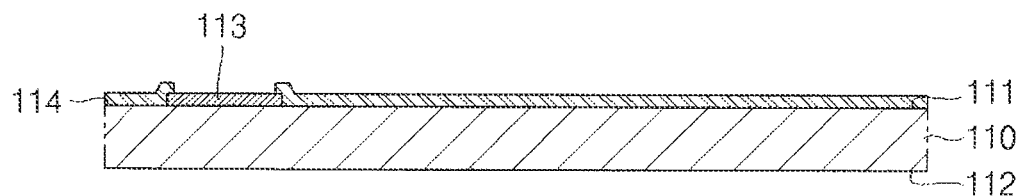
FIGS. 18A through 18E are cross-sectional views of the step-by-step method of manufacturing a semiconductor device according to another embodiment of the present invention.
Figure 18B:
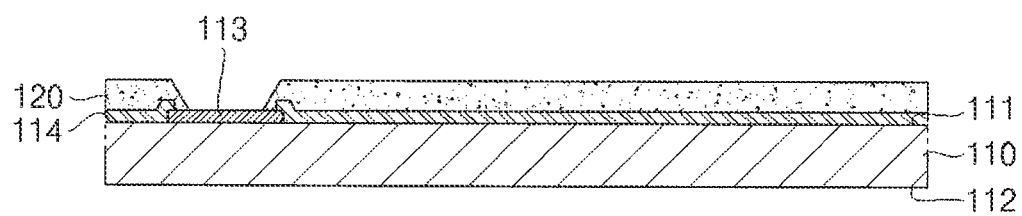
Figure 18C:
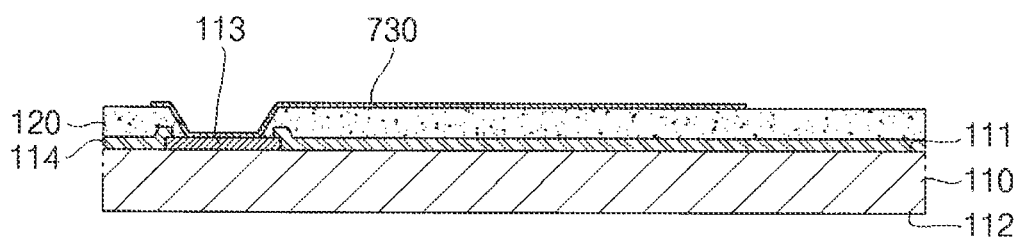

Referring to FIG. 18C, in the forming redistribution layers operation (S3), the redistribution layer 730 may be generally formed of copper (Cu). The redistribution layer 730 is plated with copper having a predetermined thickness by coating a photo resist by hardening, exposure, and developing process so that the redistribution layer 730 is extended to the bond pads 113 and the first dielectric layer 120.

Figure 18D:
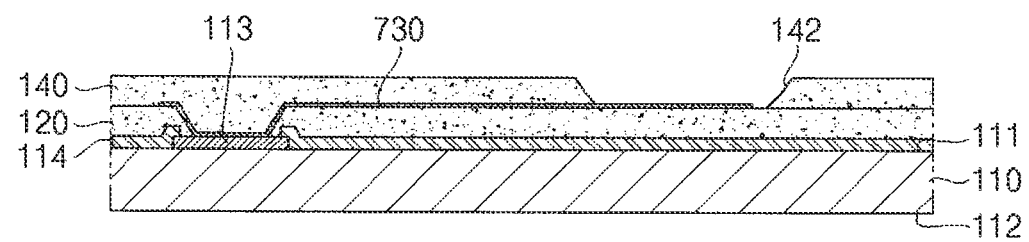
Figure 18E:
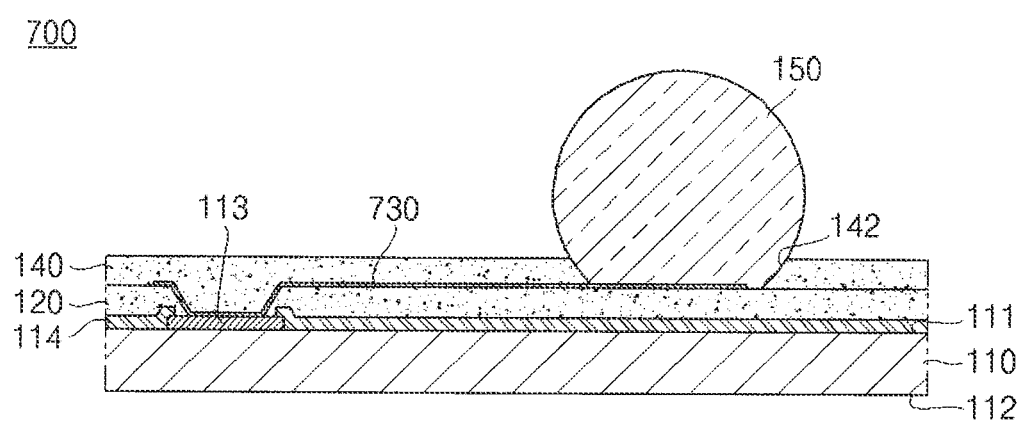

Referring now to FIGS. 18C, 18D, and 18E together, the redistribution layer 730 is externally exposed through the opening 142 of the second dielectric layer 140 that is to be formed later, so that corners of edge areas of the redistribution layer 730 can be exposed. In more detail, the redistribution layer 730 is externally exposed and is spaced apart from the opening 142 by a predetermined gap. Moreover, when the solder ball 150 is welded to the edge areas of the redistribution layer 730, the edges areas of the redistribution layer 730 are buried by the solder ball 150. The thickness of the redistribution layer 730 may be approximately 5~15 μm. Thereafter, the unnecessary photo resist located outside the redistribution layer 730 is completely etched and removed.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device comprising:
    a semiconductor die comprising:
        a first surface;
        a second surface opposite the first surface;
        a bond pad formed on the first surface; and
        a passivation layer formed on the first surface excluding the bond pad such that the bond pad is exposed through the passivation layer;
    a first dielectric layer formed on the passivation layer such that the bond pad is exposed through the first dielectric layer;
    a redistribution layer connected to the bond pad and formed on the first dielectric layer, the redistribution layer comprising:
        a first copper plated layer;
        a nickel plated layer directly on the first copper plated layer; and
        a second copper plated layer directly on the nickel plated layer;
    a second dielectric layer in which an opening is formed so that an exposed area of the redistribution layer is externally exposed through the opening while the remaining area of the redistribution layer is covered by the second dielectric layer, wherein the second copper plated layer is only inside the opening of the second dielectric layer and inwardly spaced apart with respect to and from the inner circumference of the opening in the second dielectric layer and wherein a portion of the nickel plated layer is exposed between the inner circumference of the opening in the second dielectric layer and the second copper plated layer; and
    a solder ball welded to the exposed area of the redistribution layer, wherein the second copper plated layer is positioned inside of the solder ball such that the solder ball directly contacts and is bonded to top and side surfaces of the second copper plated layer and the solder ball directly contacts the portion of the nickel plated layer exposed between the inner circumference of the opening in the second dielectric layer and the second copper plated layer.

2. The semiconductor device of claim 1, wherein the second copper plated layer does not contact the second dielectric layer, and the entire second copper plated layer is covered by the solder ball.

3. The semiconductor device of claim 1, wherein the portion of the nickel plated layer contacted by the solder ball encircles an outer perimeter of the second copper plated layer contacted by the solder ball.

4. The semiconductor device of claim 1, wherein the nickel plated layer prevents cracking of the first copper plated layer and the second copper plated layer from stress applied to the solder ball.

5. The semiconductor device of claim 1, wherein the nickel plated layer is thicker than the first copper plated layer.

6. The semiconductor device of claim 1, wherein the nickel plated layer provides a barrier layer for preventing the first copper plated layer from reacting with the solder ball.

7. The semiconductor device of claim 1, wherein the nickel plated layer has a thickness in a range of 2 micrometers to 4 micrometers, and the first copper plated layer has a thickness in a range of 1 micrometer to 2 micrometers.

8. The semiconductor device of claim 1, wherein the opening of the second dielectric layer is spaced apart from the bond pad.

9. The semiconductor device of claim 1 wherein the nickel plated layer prevents cracking of the first copper plated layer from stress applied to the solder ball.

10. The semiconductor device of claim 1 wherein the solder ball is used to deliver an electrical signal between the semiconductor die and an external device.

11. A semiconductor device comprising:
a semiconductor die comprising:
a first surface;
a bond pad on the first surface; and
a passivation layer on the first surface, the bond pad being exposed through the passivation layer;
a first dielectric layer on the passivation layer, the bond pad being exposed through the first dielectric layer;
a redistribution layer connected to the bond pad and formed on the first dielectric layer, the redistribution layer comprising:
a first copper plated layer on the first dielectric layer;
a nickel plated layer directly on the first copper plated layer; and
a second copper plated layer directly on the nickel plated layer;
a second dielectric layer comprising an opening, an exposed area of the redistribution layer being externally exposed through the opening while the remaining area of the redistribution layer is covered by the second dielectric layer, wherein the second copper plated layer is only inside the opening of the second dielectric layer and inwardly spaced apart with respect to and from the inner circumference of the opening in the second dielectric layer and wherein a portion of the nickel plated layer is exposed between the inner circumference of the opening in the second dielectric layer and the second copper plated layer; and
a solder ball welded to the exposed area of the redistribution layer, wherein the nickel plated layer provides a barrier layer for preventing the first copper plated layer from reacting with the solder ball, wherein the second copper plated layer is positioned inside of the solder ball such that the solder ball directly contacts and is bonded to top and side surfaces of the second copper plated layer and the solder ball directly contacts the portion of the nickel plated layer exposed between the inner circumference of the opening in the second dielectric layer and the second copper plated layer.

12. The semiconductor device of claim 11, wherein the second copper plated layer does not contact the second dielectric layer, and the entire second copper plated layer is covered by the solder ball.

13. The semiconductor device of claim 11 wherein the portion of the nickel plated layer contacted by the solder ball encircles an outer perimeter of the second copper plated layer contacted by the solder ball.

14. A semiconductor device comprising:
a semiconductor die comprising:
a first surface;
a second surface opposite the first surface;
a bond pad formed on the first surface; and
a passivation layer formed on the first surface excluding the bond pad such that the bond pad is exposed through the passivation layer;
a first dielectric layer formed on the passivation layer such that the bond pad is exposed through the first dielectric layer;
a redistribution layer formed on the bond pad and the first dielectric layer, the redistribution layer comprising:
a copper layer; and
a nickel layer directly on the first dielectric layer, the copper layer being formed on the entire nickel layer, the nickel layer consisting of nickel;
a second dielectric layer comprising an opening externally exposing a solid circular exposed area of the redistribution layer, the second dielectric layer covering the remaining area of the redistribution layer; and
a solder ball directly on the solid circular exposed area of the redistribution layer.

15. The semiconductor device of claim 14, wherein the copper layer and the nickel layer are formed by plating, and the nickel layer is thicker than the copper layer.

16. The semiconductor device of claim 15, wherein the nickel layer has a thickness in the range of 2 micrometers to 4 micrometers, and the copper layer has a thickness in the range of 1 micrometer to 2 micrometers.

17. The semiconductor device of claim 14 wherein the nickel layer prevents cracking of the copper layer from stress applied to the solder ball.

18. The semiconductor device of claim 14 wherein the solder ball is used to deliver an electrical signal between the semiconductor die and an external device.

* * * * *